(12) United States Patent
Seidemann et al.

(10) Patent No.: US 11,877,403 B2
(45) Date of Patent: *Jan. 16, 2024

(54) PRINTED WIRING-BOARD ISLANDS FOR CONNECTING CHIP PACKAGES AND METHODS OF ASSEMBLING SAME

(71) Applicant: Intel Corporation, Santa Clara, CA (US)

(72) Inventors: Georg Seidemann, Landshut (DE); Sonja Koller, Regensburg (DE); Bernd Waidhas, Pettendorf (DE)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/486,462

(22) Filed: Sep. 27, 2021

(65) Prior Publication Data

US 2022/0015244 A1  Jan. 13, 2022

Related U.S. Application Data

(63) Continuation of application No. 16/642,801, filed as application No. PCT/US2017/054548 on Sep. 29, 2017, now Pat. No. 11,134,573.

(51) Int. Cl.
*H05K 3/34* (2006.01)
*H01L 23/498* (2006.01)

(52) U.S. Cl.
CPC ..... *H05K 3/3436* (2013.01); *H01L 23/49816* (2013.01)

(58) Field of Classification Search
CPC ............... H05K 3/3436; H05K 3/3485; H05K 2201/049; H05K 2201/09781; H05K 2201/10734; H05K 1/141; H05K 2201/10378; H05K 2203/047; H01L 23/49816; H01L 23/13; H01L 23/49811; H01L 23/49833; H01L 23/49822; H01L 2224/16225; H01L 23/00; H01L 2924/181; Y02P 70/50

See application file for complete search history.

(56) References Cited

U.S. PATENT DOCUMENTS

| 5,598,036 | A | 1/1997 | Ho | |
| 11,134,573 | B2* | 9/2021 | Seidemann | ....... H01L 23/49833 |
| 11,322,367 | B1* | 5/2022 | Su | ..................... H01L 21/67092 |

(Continued)

FOREIGN PATENT DOCUMENTS

WO  WO-2019066950 A1  4/2019

OTHER PUBLICATIONS

"U.S. Appl. No. 16/642,801, Corrected Notice of Allowability dated Jun. 1, 2021", 5 pgs.

(Continued)

*Primary Examiner* — Douglas W Owens
(74) *Attorney, Agent, or Firm* — Akona IP PC

(57) ABSTRACT

A printed wiring-board island relieves added complexity to a printed circuit board. The printed wiring-board island creates an island form factor in the printed circuit board. Coupling of a semiconductive device package to the printed wiring-board island includes a ball-grid array. The ball-grid array can at least partially penetrate the printed wiring-board island.

20 Claims, 9 Drawing Sheets

(56) References Cited

U.S. PATENT DOCUMENTS

| | | | |
|---|---|---|---|
| 2004/0053444 A1* | 3/2004 | Yoneda | H01L 21/6835 |
| | | | 257/E23.101 |
| 2006/0138636 A1 | 6/2006 | Bormann et al. | |
| 2008/0036050 A1 | 2/2008 | Lin et al. | |
| 2012/0146209 A1* | 6/2012 | Hu | H01L 24/19 |
| | | | 257/692 |
| 2012/0244728 A1 | 9/2012 | Rathburn | |
| 2012/0279059 A1 | 11/2012 | Roberts et al. | |
| 2016/0095220 A1 | 3/2016 | Karhade et al. | |
| 2020/0352035 A1* | 11/2020 | Seidemann | H01L 23/00 |
| 2021/0217690 A1* | 7/2021 | Tian | H01L 23/562 |

OTHER PUBLICATIONS

"U.S. Appl. No. 16/642,801, Non Final Office Action dated Feb. 8, 2021", 6 pgs.

"U.S. Appl. No. 16/642,801, Notice of Allowance dated May 24, 2021", 5 pgs.

"U.S. Appl. No. 16/642,801, Preliminary Amendment filed Feb. 27, 2020", 8 pgs.

"U.S. Appl. No. 16/642,801, Response filed May 10, 2021 to Non Final Office Action dated Feb. 8, 2021", 8 pgs.

"International Application Serial No. PCT/US2017/054548, International Preliminary Report on Patentability dated Apr. 9, 2020", 10 pgs.

"International Application Serial No. PCT/US2017/054548, International Search Report dated Jun. 28, 2018", 5 pgs.

"International Application Serial No. PCT/US2017/054548, Written Opinion dated Jun. 28, 2018", 8 pgs.

\* cited by examiner

US 11,877,403 B2

1

PRINTED WIRING-BOARD ISLANDS FOR CONNECTING CHIP PACKAGES AND METHODS OF ASSEMBLING SAME

PRIORITY APPLICATION

This application is a continuation of U.S. application Ser. No. 16/642,801, filed Feb. 27, 2020, which is a U.S. National Stage Filing under 35 U.S.C. 371 from International Application No. PCT/US2017/054548, filed Sep. 29, 2017 and published in English as WO 2019/066950 on Apr. 4, 2019, all of which are incorporated herein by reference in their entirety.

FIELD

This disclosure relates to printed wiring-board islands that are mated to printed circuit boards for connecting chip packages.

BACKGROUND

Printed circuit boards have routing densities that can require multiple layers for mounting semiconductive device packaging. Routing densities sometimes require increased printed circuit-board complexity.

BRIEF DESCRIPTION OF THE DRAWINGS

Disclosed embodiments are illustrated by way of example, and not by way of limitation, in the figures of the accompanying drawings where like reference numerals may refer to similar elements, in which.

DETAILED DESCRIPTION

Increased routing density requirements for a given motherboard is accommodated by locating a printed wiring-board island onto a subsection of a larger motherboard or other printed circuit board.

Routing density of a printed wiring-board island can match that of a printed circuit board, but the need is ameliorated, to engineer and manufacture entire additional layers for the printed circuit board. Routing density of the printed wiring-board island on the die side may be different than that of the printed circuit board, and the printed wiring-board island translates from one routing density to the other between the die side and the board side.

Figure 1:
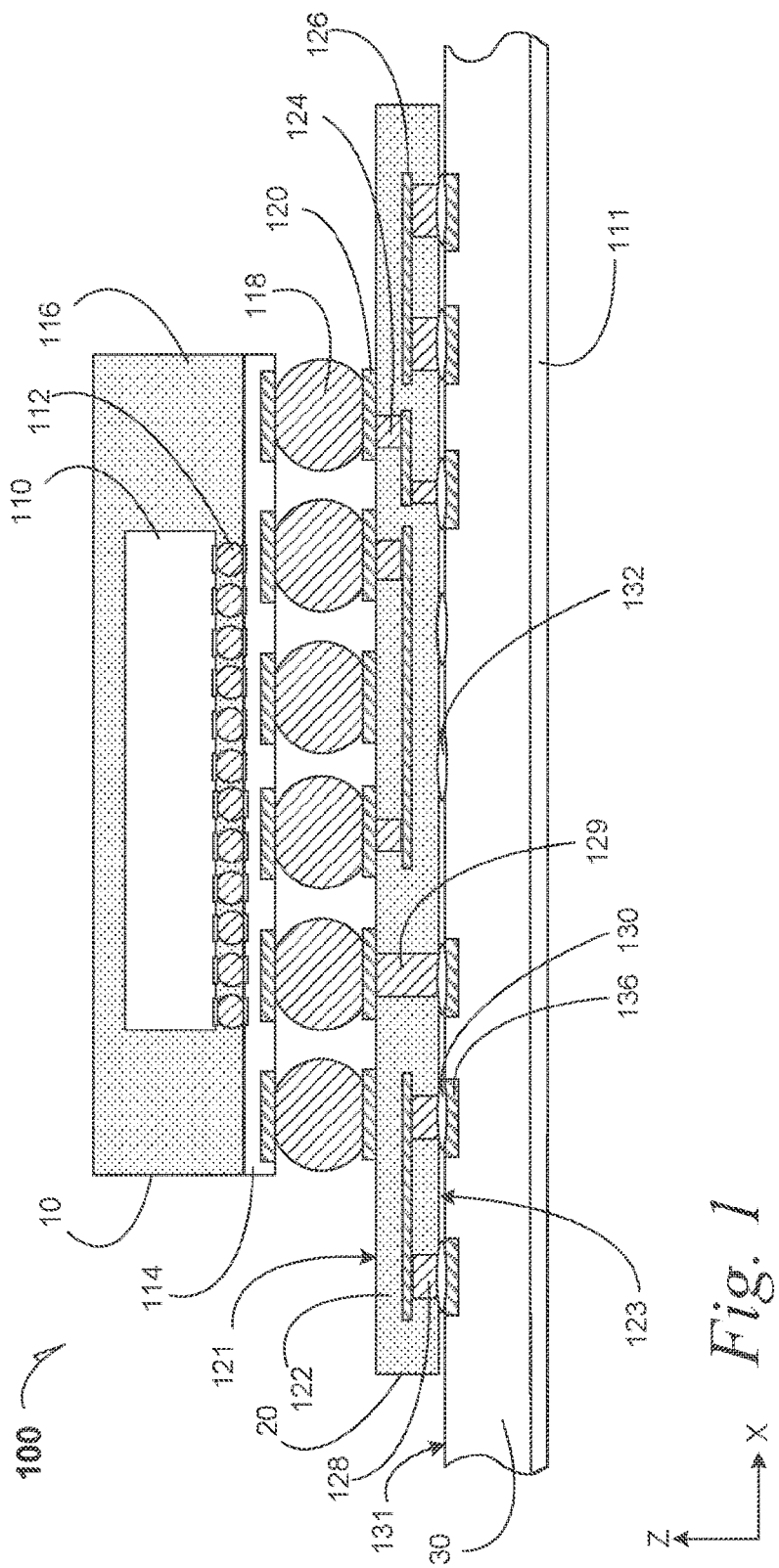
FIG. 1 is a cross-section elevation of a printed wiring-board island in an apparatus according to an embodiment.

FIG. 1 is a cross-section elevation of a printed wiring-board island 20 in an apparatus 100 according to an embodiment. A semiconductive device package 10 includes a semiconductive device 110 that is micro bumped 112 onto a redistribution substrate 114. The semiconductive device 110 is encapsulated in a molding compound 116 according to an embodiment.

A printed circuit board 30 such as a motherboard 30 has a given wiring density that may be determined by a set of design rules and wiring layers (not illustrated), but assembly of the semiconductive device package 10 requires different routing density than what is contained the printed circuit board 30 in an embodiment. In an embodiment, the routing density is the same for the printed wiring-board island 20 and the printed circuit board 30, but the need is ameliorated to fabricate an entire additional layer in the printed circuit board 30. Hereinafter, the printed circuit board 30, or also referred to as the motherboard 30, may be referred to as a printed circuit board (PCB) 30.

In an embodiment, a printed wiring-board island 20 is presented against the PCB 30. The printed wiring-board island 20 electrically couples the semiconductive device package 10 to the PCB 30 through a land-side ball-grid array 118 (one instance enumerated) that mates to a series of ball pads 120 (one instance enumerated). In an embodiment, the package 10 includes an integrated passive device (IPD) that communicates through the land-side ball-grid array 118. In an embodiment, the package 10 includes both a semiconductive device such as the illustrated semiconductive device 110, as well as a IPD (not pictured) that is either side-by-side along the X-direction of the illustrated cross section, or side-by-side with the semiconductive device 110 in the Y-direction, which is either into or out of the plane of the drawing illustrated in FIG. 1.

In an embodiment, the printed wiring-board island (PWB island) 20 includes an organic section 122 with a die side 121 and a board side 123. The organic section 122 may be several layers that accommodate lateral traces and vertical vias. In an embodiment, one or more integrated passive devices (TPDs) (not pictured) are mounted on the die side 121 of the PWB island 20 side-by-side with the package 10 along the X-direction of the illustrated cross section. Within the organic section 122 is found in this embodiment, a one-layer trace redistribution complexity illustrated by a die-coupling via 124 (one instance indicated), a trace level 126 and a board-coupling via 128. In an embodiment, the PWB island 20 illustrated also includes a through-board via 129 that communicates from the die side 121 to the board side 123 of the PWB island 20.

In an embodiment, the PWB island 20 includes the structural function of translating between a die-side routing density to a board-side routing density. For example, the semiconductive device package 10 has a routing density that the PWB island 20 is configured to meet, and the PWB island 20 includes a routing density on the board side 123 that is configured to meet the routing density of the PCB 30. In an embodiment, the die-side routing density is different from the board-side routing density. In an embodiment, the die-side routing density is the same as the board-side routing density, but because the PWB island 20 is used, an entire additional at least one layer is not required to add to the PCB 30.

In any event, the PWB island 20 provides sufficient complexity to mate the semiconductive device package 10 to the PCB 30, without requiring an additional entire new layer or layers, to be designed and added to the PCB 30. Consequently, local complexity of a PWB island embodiment relieves additional design and fabrication burdens required to couple a given semiconductive device package to a given PCB.

As illustrated, the PCB 30 is depicted only as a portion of a complete printed circuit board, and it is illustrated only where the PWB island 20 needs to be located, and not to the entire package-side surface 131 of the PCB 30.

In an embodiment, attachment and electrical communication between the PWB island 20 and the PCB 30 is accomplished by solder-paste printing (SPP) onto the PWB island 20 at locations for board-coupling vias 128 as well as for through-board vias 129. For example, a printed solder paste 130 has been printed onto the PWB island 20 on the board side 123, and the PWB island 20 is thermally bonded to the PCB 30 at PCB bond pads 136 (one instance enumerated). In another example embodiment, the printed solder paste 130 has been printed onto the PCB 30 and the PWB island 20 is thermally bonded to the PCB 30 at the several PCB bond pads 136.

Further attachment mechanisms are used in an embodiment, such as a thermo-coupling, non-conductive paste (TCnCP) 132 that is located at a useful position to complement and supplement bonding qualities of the printed solder-paste 130. In an embodiment, the TCnCP 132 is identical to the printed solder paste 130, but because it has been placed in a useful location without completing any electrical couplings, it may be referred to as a dummy printed solder paste 132. In an embodiment, the TCnCP 132 is similar in bonding quality to the printed solder paste 130, but it does not exhibit electrical conductivity. In any event, because the TCnCP 132 has been placed in a useful location without any electrically conductive qualities, it may be referred to as a dummy printed solder paste 132.

In an embodiment, the PWB island 20 has a single trace layer 126 (as illustrated) to address accommodating the wiring density of the semiconductive device package 10 to the different- or less-complex wiring of the PCB 30. In an embodiment, the PWB island 20 has a two trace layers. In an embodiment, the PWB island 20 has a three trace layers. In an embodiment, the PWB island 20 has a four trace layers.

As illustrated, the PWB island 20 creates an island form factor upon the PCB 30. One aspect of the PWB island 20 form factor is a die side 121 surface in a difference Z-direction plane than the package-side surface 131 of the PCB 30. Additionally, at least one dimension in the X-Y plane for the PWB island 20 is smaller than that of the PBC 30.

Figure 2:
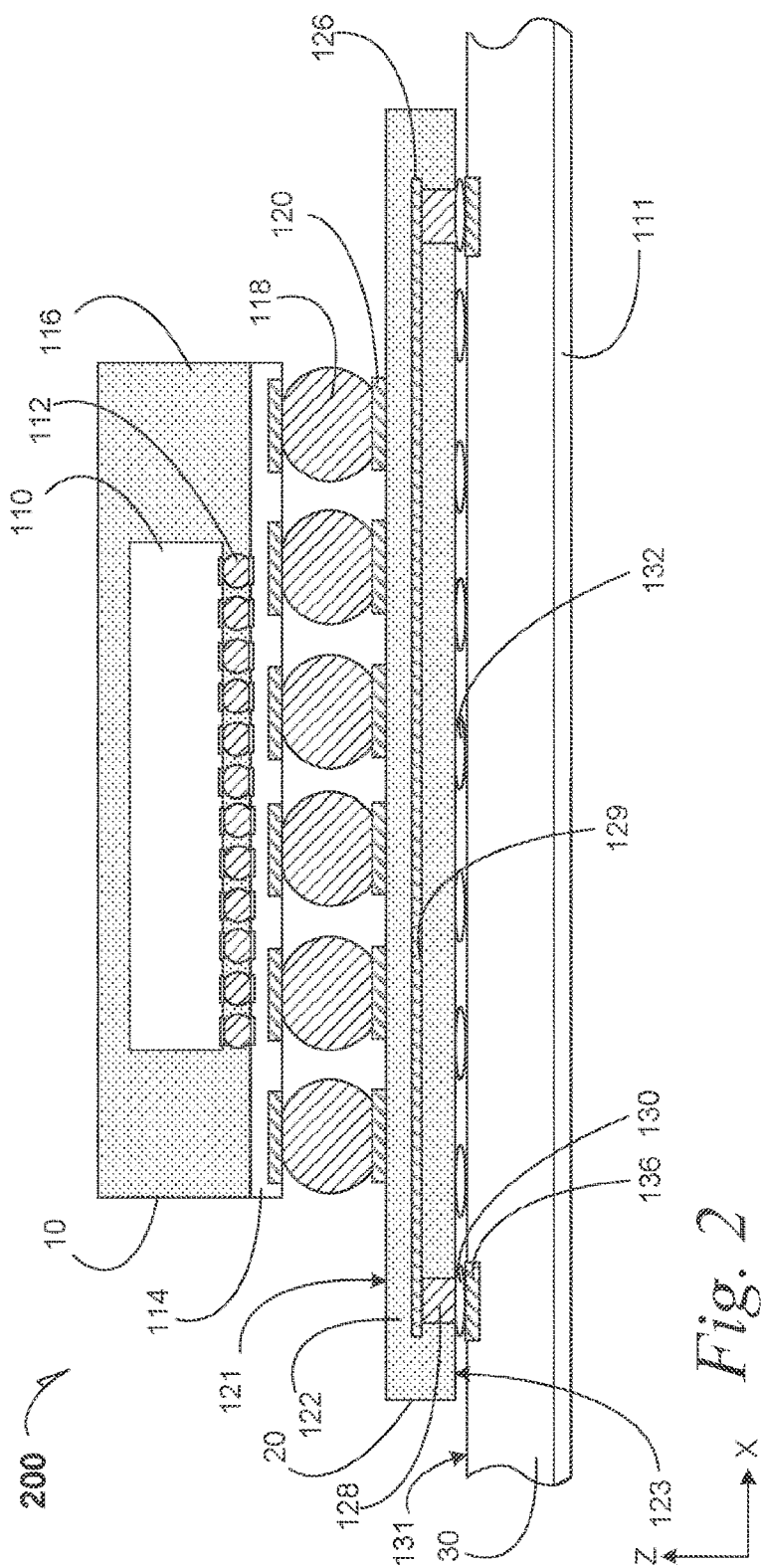
FIG. 2 is a cross-section elevation of a printed wiring-board island in an apparatus according to an embodiment.

FIG. 2 is a cross-section elevation of a printed wiring-board island 20 in an apparatus 200 according to an embodiment. A semiconductive device package 10 includes a semiconductive device 110 that is micro bumped 112 onto a redistribution substrate 114. The semiconductive device 110 is encapsulated in a molding compound 116 according to an embodiment. In an embodiment, the PWB island 20 is the same PWB island 20 depicted in FIG. 1, but the cross-section elevation view is taken from a different location orthogonal to the plane of the FIG. 1 drawing.

A printed circuit board 30 such as a motherboard 30 has a given set of wiring density that may be determined by useful design rules and wiring layers (not illustrated), but assembly of the semiconductive device package 10 requires more wiring density than is contained the printed wiring board 30. Hereinafter, the printed circuit board 30, or also referred to as the motherboard 30, may be referred to as a printed circuit board (PCB) 30.

In an embodiment, a printed wiring-board island 20 is presented against the PCB 30. The PWB island 20 electrically couples the semiconductive device package 10 to the PCB 30 through a land-side ball-grid array 118 (one instance enumerated) that mates to a series of ball pads 120 (one instance enumerated).

In an embodiment, the PWB island 20 includes an organic section 122 with a die side 121 and a board side 123. The organic section 122 may be several layers that accommodate lateral traces and vertical vias. Within the organic section 122 is found in this embodiment, a one-layer trace redistribution complexity illustrated by a trace level 126 and a board-coupling via 128. The PWB island 20 also fans out over a section of the PCB 30 to accommodate the routing density of the PCB 30.

In any event, the PWB island 20 provides sufficient complexity to mate the semiconductive device package 10 to the PCB 30, without requiring an additional entire new layer or layers, to be designed and added to the PCB 30. Consequently, local complexity of a PWB island embodiment relieves additional design and fabrication burdens required to couple a given semiconductive device package to a given PCB.

As illustrated, the PCB 30 is depicted only as a portion of a complete printed circuit board, and is illustrated only where the PWB island 20 needs to be located, and not to the entire package-side surface 131 of the PCB 30.

In an embodiment, attachment and electrical communication between the PWB island 20 and the PCB 30 is accomplished by solder-paste printing onto locations for board-coupling vias 128. For example, a printed solder-paste 130 has been printed onto the PWB island 20 on the board side 123, and the PWB island 20 is thermally bonded to the PCB 30. In another example, the printed solder paste 130 has been printed onto the PCB 30 at a PCB bond pad 136 (one instance enumerated) and the PWB island 20 is thermally bonded to the PCB 30.

Further attachment mechanisms are used in an embodiment, such as a TCnCP 132 that is located at a useful position to complement and supplement bonding qualities of the printed solder-paste 130. In an embodiment, the TCnCP 132 is identical to the printed solder paste 130, but because it has been placed in a useful location without completing any electrical couplings, it may be referred to as a dummy printed solder paste 132. In an embodiment, the TCnCP 132 is similar in bonding quality to the printed solder paste 130, but it does not exhibit electrical conductivity. In any event, because the TCnCP 132 has been placed in a useful location without any electrically conductive qualities, it may be referred to as a dummy printed solder paste 132.

In an embodiment, the PWB island 20 has a single trace layer to address accommodating the wiring complexity of the semiconductive device package 10 to the less-complex wiring of the PCB 30. In an embodiment, the PWB island 20 has a two trace layers. In an embodiment, the PWB island 20 has a three trace layers. In an embodiment, the PWB island 20 has a four trace layers.

Figure 3:
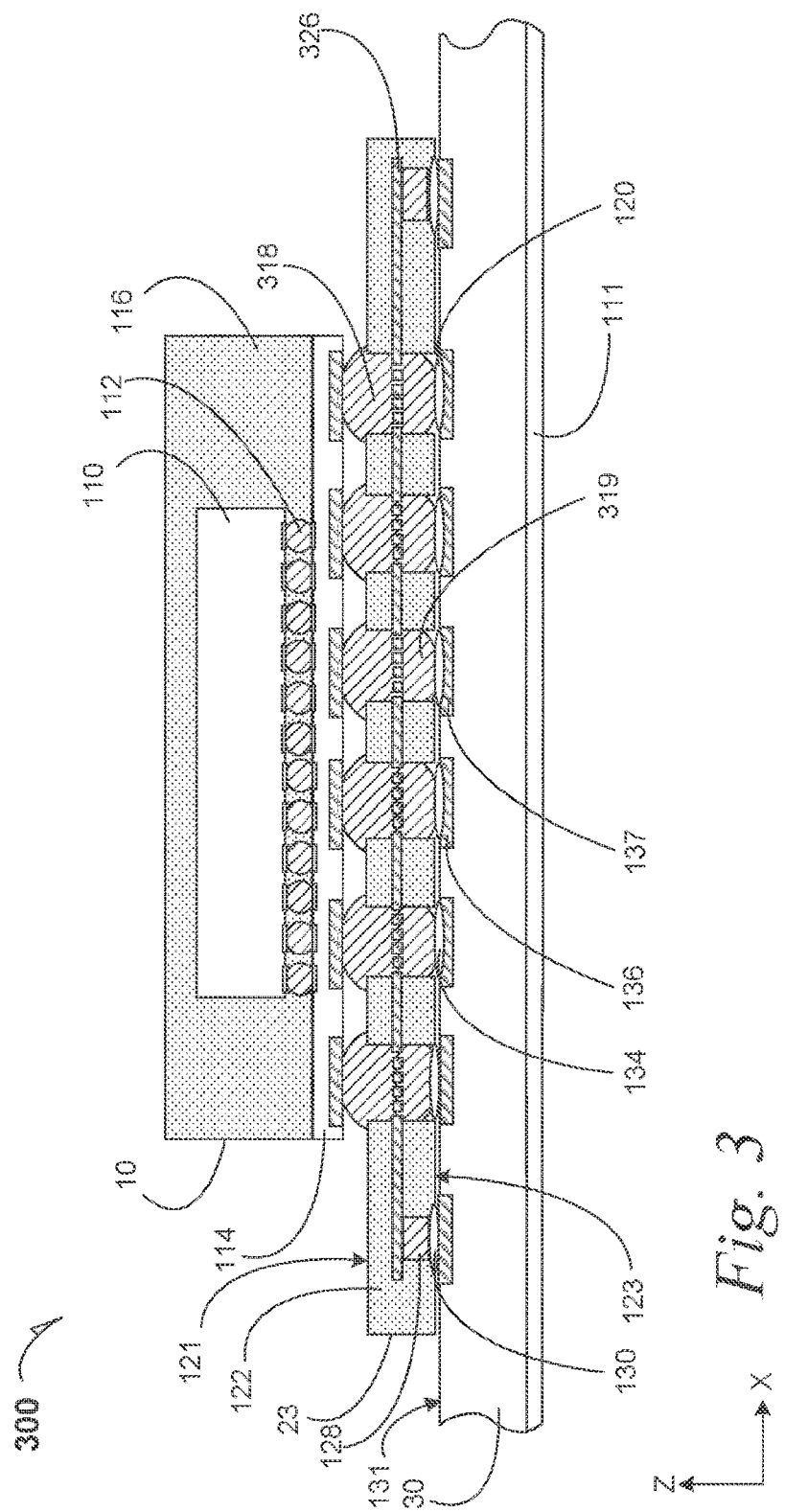
FIG. 3 is a cross-section elevation of a printed wiring-board island in an apparatus according to an embodiment.

FIG. 3 is a cross-section elevation of a printed wiring-board island 23 in an apparatus 300 according to an embodiment. In some embodiments, applications of a given PWB island 23 is useful to maintain a lower Z-profile by allowing the land-side ball-grid array 318 to penetrate at least partially through the PWB island 23.

A semiconductive device package 10 includes a semiconductive device 110 that is micro bumped 112 onto a redistribution substrate 114. The semiconductive device 110 is encapsulated in a molding compound 116 according to an embodiment.

A printed circuit board 30 such as a motherboard 30 has a given wiring density that may be determined by a set of design rules and wiring layers (not illustrated), but assembly of the semiconductive device package 10 requires more wiring density than contained in the printed circuit board 30. Hereinafter, the printed circuit board 30, or also referred to as the motherboard 30, may be referred to as a printed circuit board (PCB) 30.

In an embodiment, the printed wiring-board island 23 is presented against the PCB 30. The PWB island 23 electrically couples the semiconductive device package 10 to the PCB 30 through the penetrating ball-grid array 318 (one instance enumerated) that mates to the redistribution substrate 114, passes at least partially through the PWB island 23, and bonds to the PCB bond pads 136.

In an embodiment, the PWB island 23 includes an organic section 122 with a die side 121 and a board side 123. The organic section 122 may be several layers that accommodate lateral traces and vertical vias. Within the organic section 122 is found in this embodiment, a one-layer trace redistribution complexity illustrated by a trace level 326 and a board-coupling via 128.

In any event, the PWB island 23 provides sufficient complexity to mate the semiconductive device package 10 to the PCB 30, without requiring additional new layer or layers, to be designed and added to the PCB 30. Consequently, local complexity of a PWB island embodiment relieves additional design and fabrication burdens required to couple a given semiconductive device package to a given PCB.

In the illustrated embodiment, the several penetrating balls of the penetrating ball-grid array 318 are connected to a bus trace 326, and the bus trace 326 also has an X-direction fan-out feature.

As illustrated, the PCB 30 is depicted only as a portion of a complete printed circuit board, and it is illustrated only where the PWB island 23 needs to be located, and not to the entire package-side surface 131 of the PCB 30.

In an embodiment, attachment and electrical communication between the PWB island 23 and the PCB 30 is accomplished by solder-paste printing onto locations for board-coupling vias 128. For example, a printed solder-paste 130 has been printed onto the PWB island 23 and the PWB island 23 is thermally bonded to the PCB 30. In another example, the printed solder paste 130 has been printed onto the PCB 30 and the PWB island 23 is thermally bonded to the PCB 30.

Further attachment mechanisms are used in an embodiment, such as printed solder paste 134 that mates the several PCB bond pads 136 to the penetrating ball-grid array 318. In an embodiment, only the printed solder paste 130 is used as the printed solder paste 134 is not necessary where the penetrating ball-grid array 318 reflows through the PWB island 23 and bonds onto the PCB bond pads 136.

In an embodiment, the PWB island 23 has a single trace layer (as illustrated) to address accommodating the wiring complexity of the semiconductive device package 10 to the less-complex wiring of the PCB 30. In an embodiment, the PWB island 23 has two trace layers. In an embodiment, the PWB island 23 has a three trace layers. In an embodiment, the PWB island 23 has a four trace layers.

In an embodiment although the several penetrating balls 318 may mate onto the PCB 30 and the package side 131, a given penetrating ball 319 mates onto a dummy bond pad 137 and the connection is solely structural and not electrical.

Figure 4:
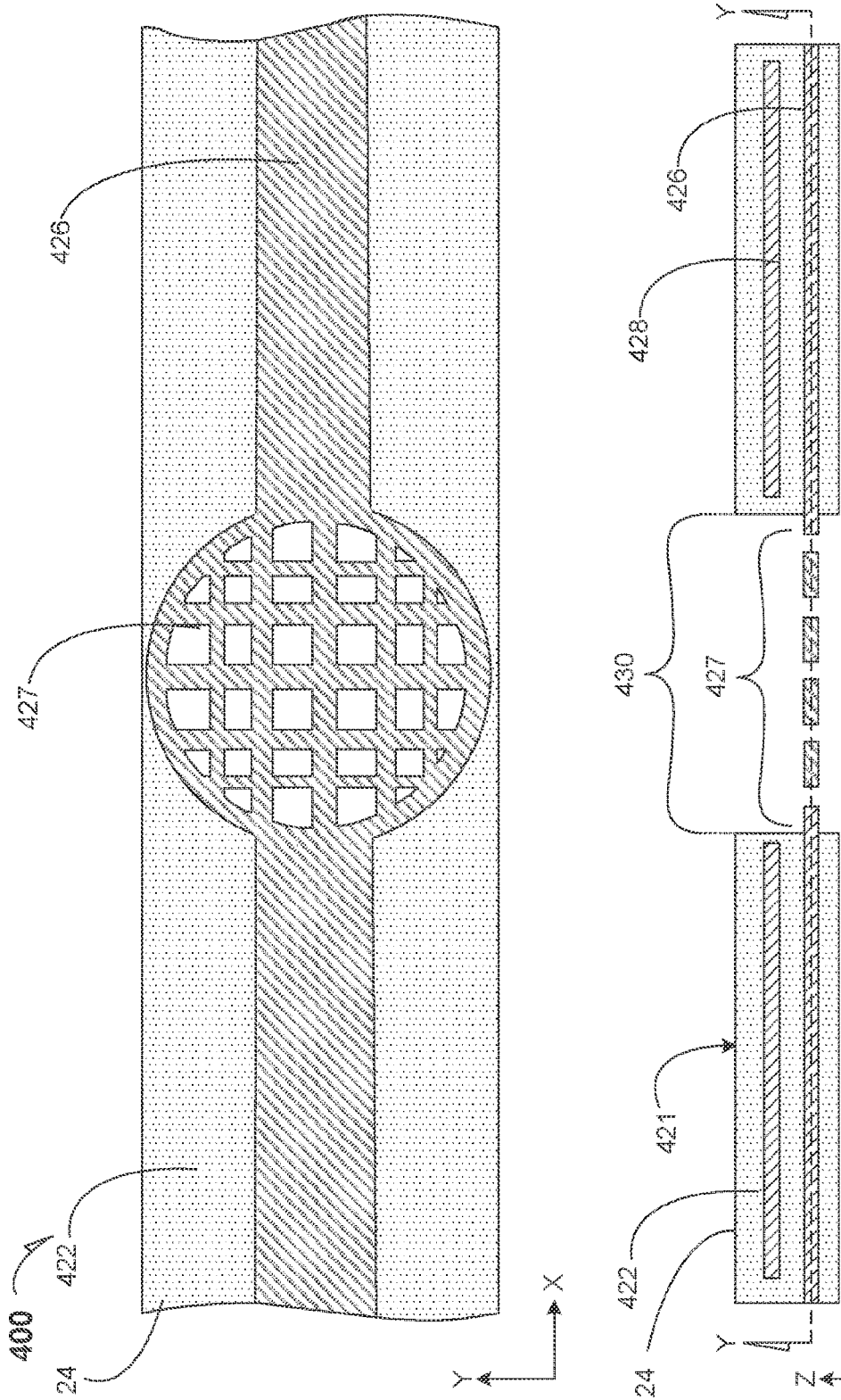
FIG. 4 illustrates a top plan cut away and a cross-section elevation of a portion of a printed wiring-board island according to an embodiment.

FIG. 4 illustrates a top plan cut away (X-Y) and a cross-section elevation (X-Z) of a portion of a printed wiring-board island 24 according to an embodiment.

In the top plan cut away X-Y, a trace 426 that is part of the PWB island 24, similar to the PWB island 23 depicted in FIG. 3, has been laid bare within the organic section 422. The top plan cut away X-Y is taken from the section line Y-Y from the cross-section elevation XZ.

A meshed bump pad 427 is embedded within the organic section 422, and the meshed bump pad 427 is part of the trace 426, and the meshed bump pad 427 allows for a penetrating solder such as the penetrating balls 318 such as depicted in FIG. 3, to partially pass through the meshed bump pad 427 and bond with the PCB bond pad 136, also depicted in FIG. 3.

In the cross-section elevation X-Z, this embodiment illustrates the meshed bump pad 427 as it is exposed with a bump corridor 430 that opens the die side 421 of the PWB island 24 within the organic section 422 of the PWB island 24. Additionally in this embodiment, a second trace level 428 is depicted above the first trace 426, such that the organic section 422 has two trace layers.

Figure 5:
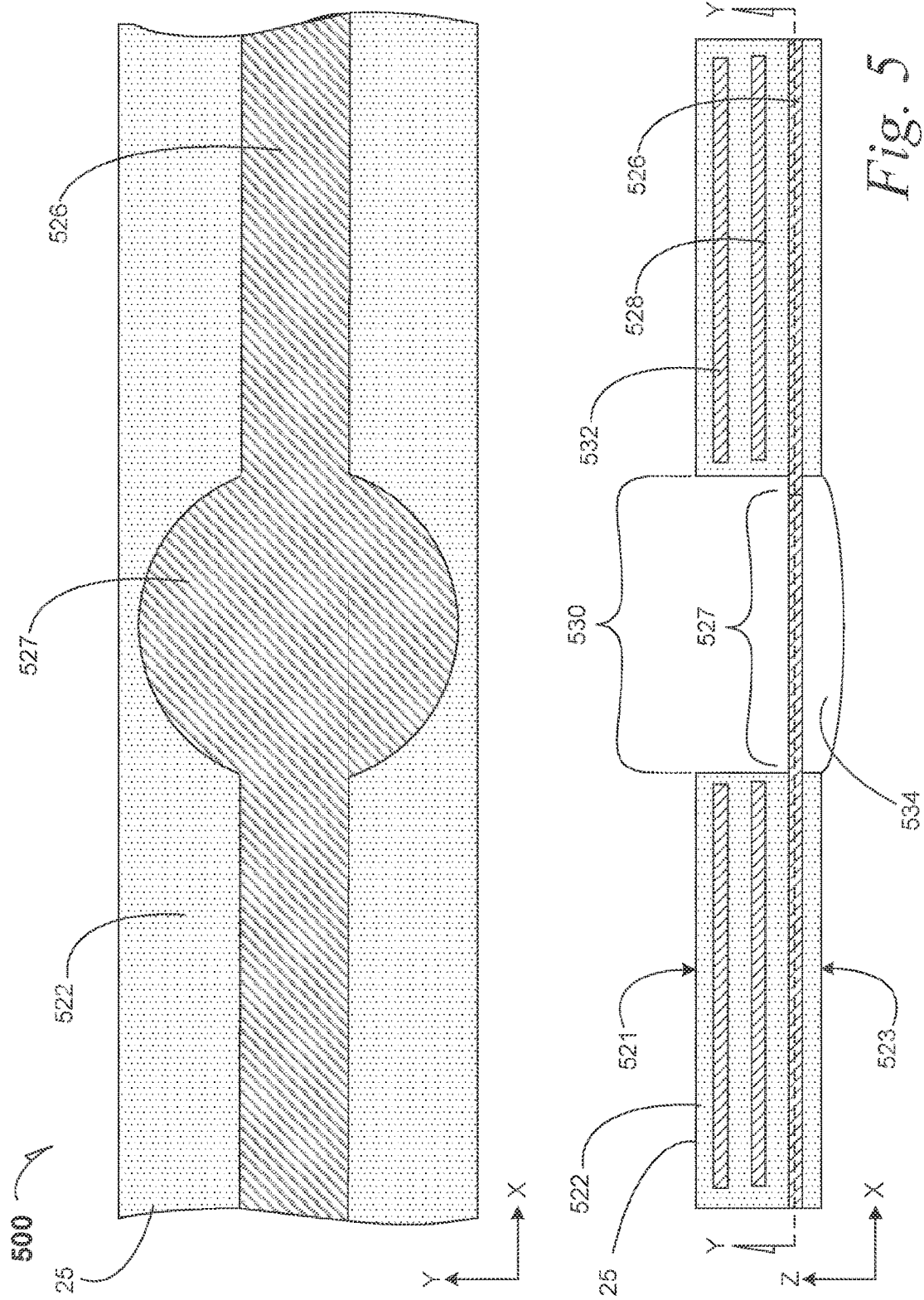
FIG. 5 illustrates a top plan cut away and a cross-section elevation of a portion of a printed wiring-board island according to an embodiment.

FIG. 5 illustrates a top plan cut away (X-Y) and a cross-section elevation (X-Z) of a portion of a printed wiring-board island 25 according to an embodiment.

In the top plan cut away X-Y, a trace 526 that is part of the PWB island 25, similar to the PWB island 23 depicted in FIG. 3, has been laid bare within the organic section 522. The top plan cut away X-Y is taken from the section line Y-Y from the cross-section elevation X-Z.

A bump pad 527 is part of the trace 526, and the bump pad 527 is complemented by a solder-paste printed bump 534 (see the cross-section elevation X-Z), that allows for a continuing electrical connection for the solder balls such as the solder balls 318 depicted in part in FIG. 3, to pass through the PWB island 25 and electrically connect with the bond pad 527. Accordingly, the solder-paste printed bump 534, the bond pad 527 and the solder ball (see item 318 in FIG. 3) complete a connection through the PWB island 25. As illustrated, the solder-paste printed bump 534 is in contact with the bump pad 527 at a board side 523 of the PWB island 25.

In the cross-section elevation X-Z, this embodiment illustrates the bump pad 527 as it is exposed with a bump corridor 530. The bump corridor 530 opens the die side 521 of the PWB island 25 within the organic section 522 of the PWB island 25.

The bump corridor 530 can also open the board side 523 of the PWB island 25. Additionally in this embodiment, a second trace level 528 is depicted above the first trace 526. Additionally in this embodiment, a third trace level 532 is depicted above the second trace level 528, such that the organic section 522 has three trace layers.

Figure 6:
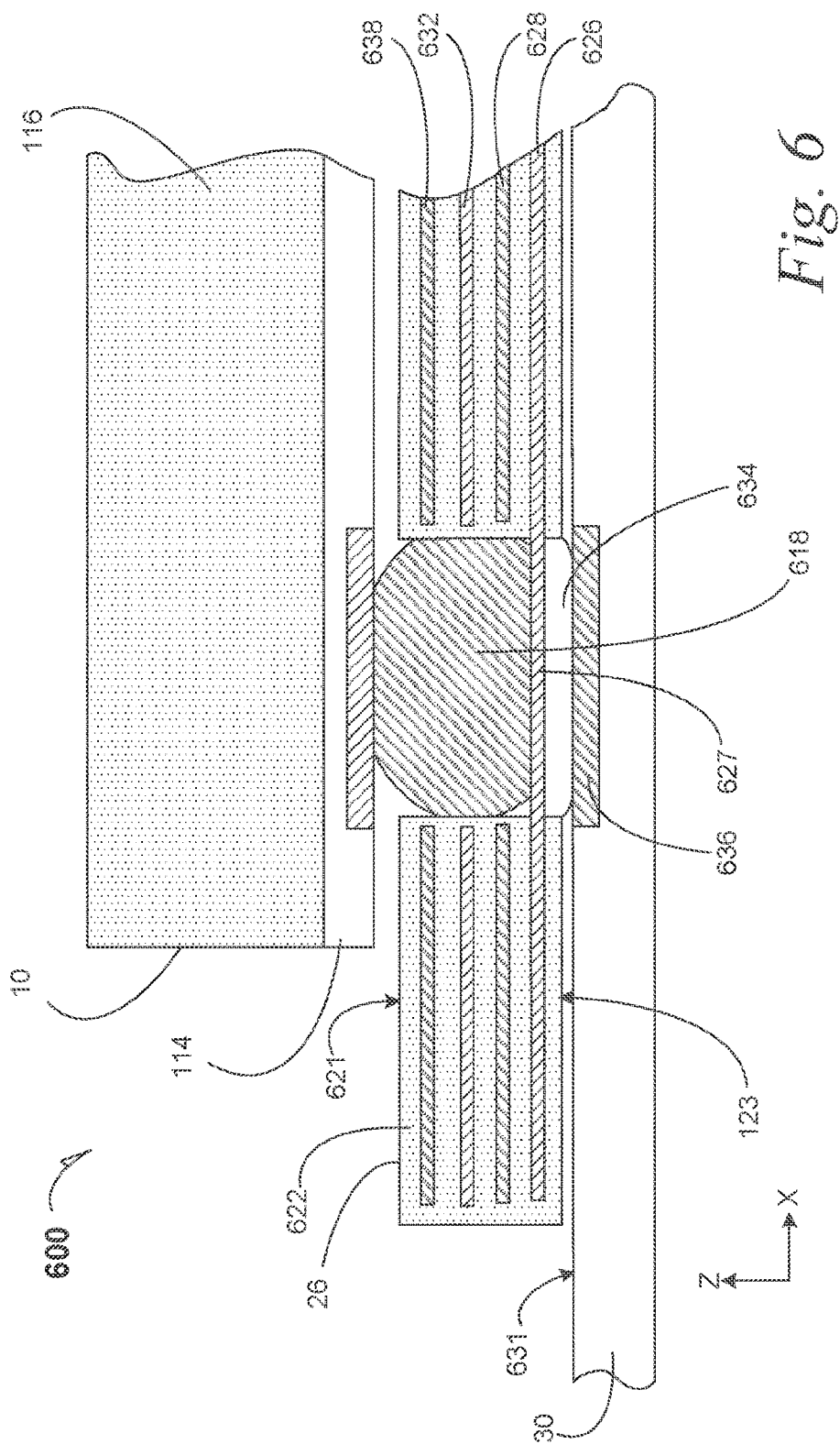
FIG. 6 is a cross-section elevation of a portion of a printed wiring-board island in an apparatus according to an embodiment.

FIG. 6 is a cross-section elevation of a portion of a printed wiring-board island 26 in an apparatus 600 according to an embodiment. A trace 626 is part of the PWB island 26, similar to the PWB island 23 depicted in FIG. 3. The trace 626 is found within the organic section 622. A bump pad 627 is part of the trace 626, and the bump pad 627 is complemented by a solder-paste printed bump 634 that allows for a continuing electrical connection for the solder ball 618, to partially pass through the PWB island 26 and electrically connect with the bump pad 627. Accordingly, the solder-paste printed bump 634, the bump pad 627 and a penetrating solder ball 618 complete a connection through the PWB island 26.

Additionally in this embodiment, a second trace level 628 is depicted above the first trace 626. Additionally in this embodiment, a third trace level 632 is depicted above the second trace level 628. Additionally in this embodiment, a fourth trace level 638 is depicted above the third trace level 632, such that the organic section 622 has four trace layers.

It may now be understood that each embodiment illustrated in FIG. 1 may include up to four trace levels as illustrated in FIG. 6. It may now be understood that each embodiment illustrated in FIG. 2 may include up to four trace levels as illustrated in FIG. 6. It may now be understood that each embodiment illustrated in FIG. 3 may include up to four trace levels as illustrated in FIG. 6. It may now be understood that each embodiment illustrated in FIG. 4 may include up to four trace levels as illustrated in FIG. 6. It may now be understood that each embodiment illustrated in FIG. 5 may include up to four trace levels as illustrated in FIG. 6.

Figure 7:
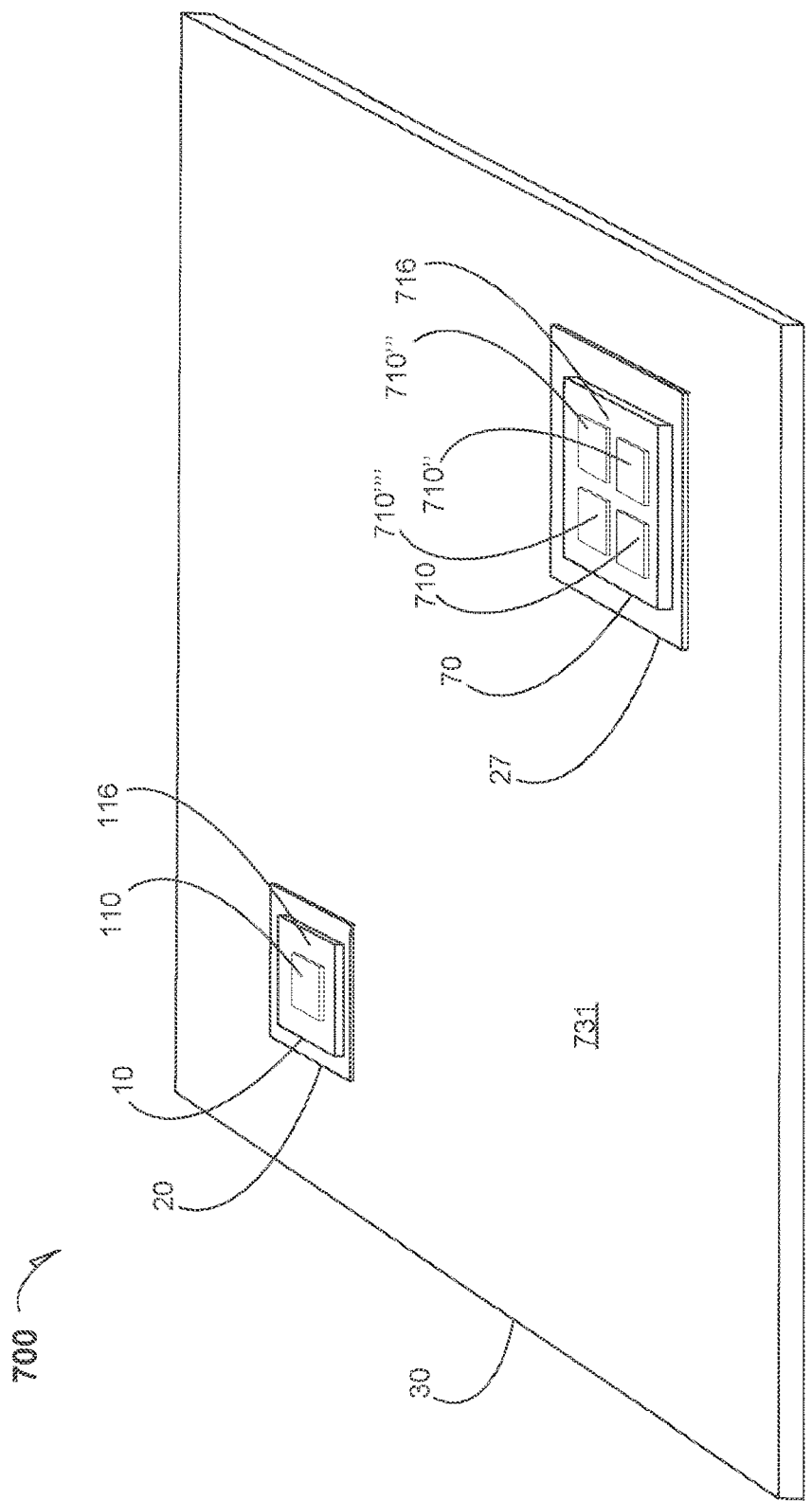
FIG. 7 is perspective elevation of a computing system according to an embodiment

FIG. 7 is perspective elevation of a computing system 700 according to an embodiment. A printed circuit board 30 carries several active devices and components (not pictured), and the PCB 30 is configured with a printed wiring-board island 20 similar to the PWB island 20 depicted in FIG. 1 for example. The PCB 30 includes an entire upper surface that is a package-side surface 731.

The semiconductive device 110 is affixed in a molding compound 116, and the semiconductive device 110 is depicted in ghosted lines within the molding compound 116. In an embodiment, the semiconductive device 110 is mated to a PWB island 20 such as the PWB island 23 depicted in FIG. 3.

As illustrated, the PWB island 20 creates an island form factor upon the PCB 30. One aspect of the PWB island 20 form factor is a die side 121 surface in a difference Z-direction plane than the package-side surface 731 of the PCB 30. Additionally, at least one dimension in the X-Y plane for the PWB island 20 is smaller than that of the PBC 30. In other words, the island form factor includes at least one edge of the PWB island 20, within the X-Y plane, not sharing an edge with the PCB 30 in an X-Z plane, nor in a Y-Z plane. As illustrated, no edge of the PWB island 20 shares an edge, neither in the X-Z plane nor the Y-Z plane with any edge of the PCB 30.

In several embodiments, selected ball sizes are used for a given useful application. Table 1 depicts selected ball sizes for application to through-PWB island embodiments.

TABLE 1

Package Standoff during PWB Island Assembly

| Ball size, e.g. item 118 | Z-height after Ball apply | Z-height after PCB assembly |
| --- | --- | --- |
| 300 µm | 210 µm | 180 µm |
| 250 µm | 190 µm | 150 µm |
| 230 µm | 170 µm | 130 µm |
| 220 µm | 160 µm | 120 µm |
| 200 µm | 140 µm | 100 µm |
| 180 µm | 110 µm | 80 µm |

In an embodiment, a system in a package includes a PWB island 27 and several devices embedded in a package 70 that includes a molding compound 716. A core processor 710 (depicted in ghosted lines) is paired with a baseband processor 710". A memory module 710''' is also affixed in the molding compound 716, and a combination memory-controller hub and platform-controller hub 710'''' is mated with the other devices. The several devices 710, 710", 710''' and 710'''' communicate through the PWB island 27 to the PCB 30. As illustrated, the PWB island 27 creates an island form factor upon the PCB 30.

In an embodiment, at least one semiconductor device package is mounted on the PWB island 27. In an embodiment, several devices are assembled, side-by-side on the PWB island 27. For example, item 710 is a processor package, item 710" is a baseband processor package including a baseband processor and an IPD, item 710''' is a memory-controller hub package, and item 710'''' is a platform-controller hub package. In an embodiment, any subset of the aforementioned packages is mounted on the PWB island 27, and the molding compound 716, if present, covers the several packages.

As illustrated, the PWB island 27 creates an island form factor upon the PCB 30. One aspect of the PWB island 27 form factor is a die side 721 surface in a difference Z-direction plane than the package-side surface 731 of the PCB 30. Additionally, at least one dimension in the X-Y plane for the PWB island 20 is smaller than that of the PBC 30. In other words, the island form factor includes at least one edge of the PWB island 27, within the X-Y plane, not sharing an edge with the PCB 30 in an X-Z plane, nor in a Y-Z plane. As illustrated, no edge of the PWB island 27 shares an edge, neither in the X-Z plane nor the Y-Z plane with any edge of the PCB 30.

Figure 8:
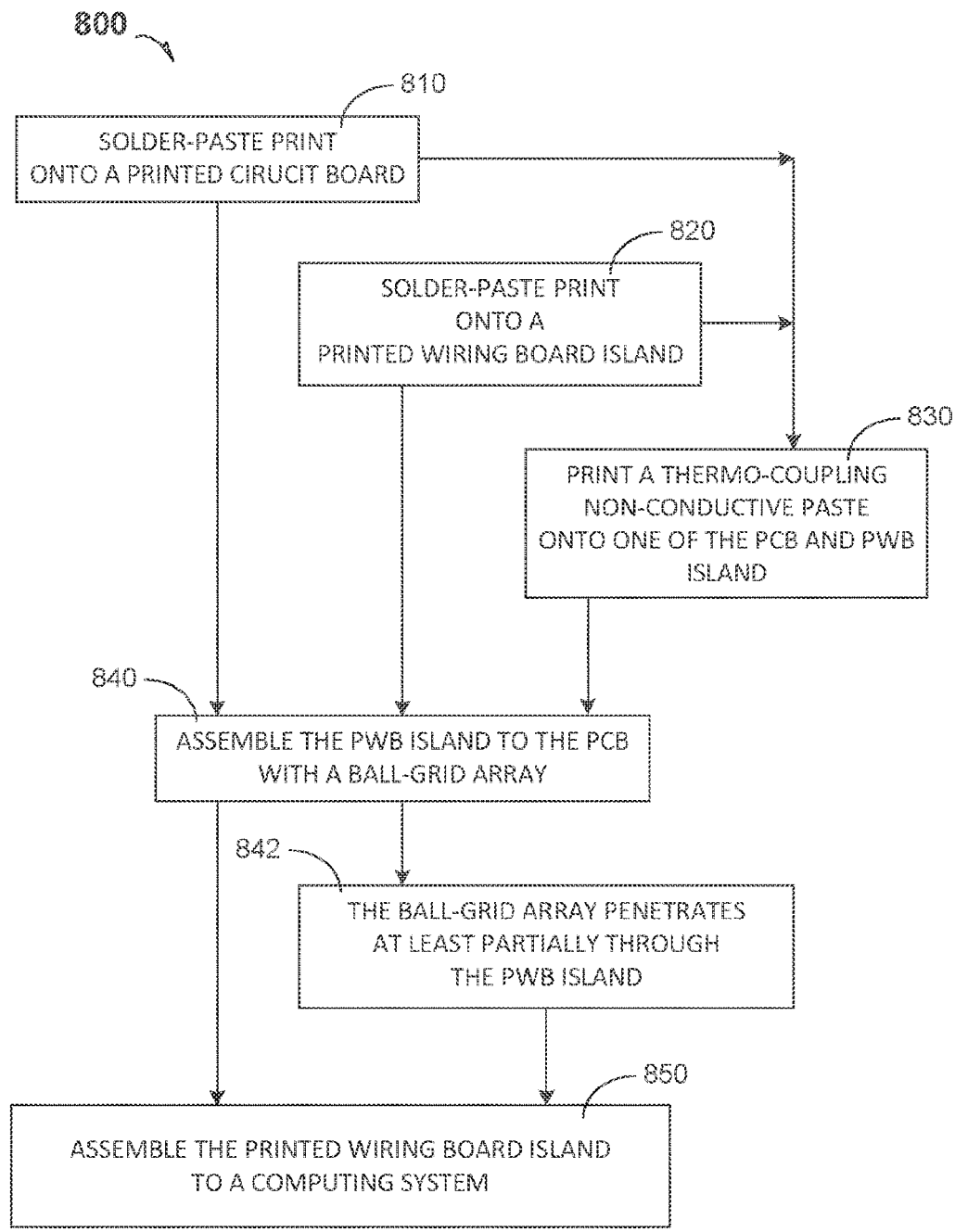
FIG. 8 is a process flow diagram for assembly of a printed wiring-board island according to several embodiments.

FIG. 8 is a process flow diagram 800 for assembly of a printed wiring-board island according to several embodiments.

At 810, the process includes solder-paste printing onto a printed circuit board.

At 820, the process alternatively includes solder-paste printing onto the printed wiring-board island.

At 830, the process alternatively includes printing a TCnCP onto one of the PCB and the PWB island for the utility of uniform adhesion and package-to-board leveling.

At 840, the process includes assembling the printed wiring-board island to the printed circuit board. The assembly process may include thermal reflow of the ball-grid array. In an embodiment, processing begins at 840.

At 842, the process alternatively includes assembling the ball-grid array by at least partially penetrating the PWB island.

At 850, the process includes assembling the PWB island-containing semiconductive device package to a computing system.

Figure 9:
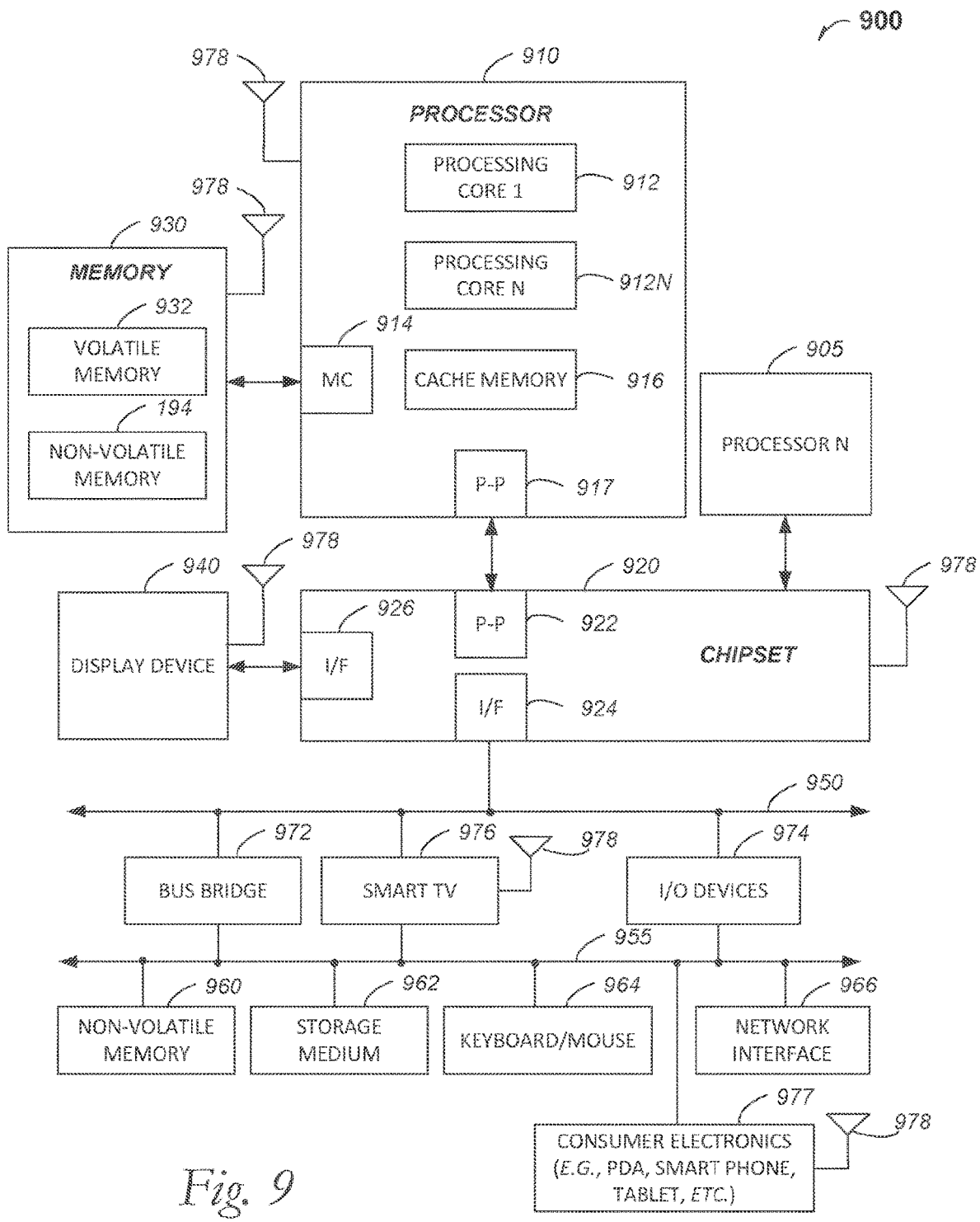
FIG. 9 is included to show an example of a higher-level device application for the disclosed embodiments.

FIG. 9 is included to show an example of a higher-level device application for the disclosed embodiments. The printed wiring-board island embodiments may be found in several parts of a computing system. In an embodiment, a printed wiring-board island computing system 900 includes, but is not limited to, a desktop computer. In an embodiment, a printed wiring-board island system 900 includes, but is not limited to a laptop computer. In an embodiment, a printed wiring-board island system 900 includes, but is not limited to a netbook. In an embodiment, a printed wiring-board island system 900 includes, but is not limited to a tablet. In an embodiment, a printed wiring-board island system 900 includes, but is not limited to a notebook computer. In an embodiment, a printed wiring-board island system 900 includes, but is not limited to a personal digital assistant (PDA). In an embodiment, a printed wiring-board island system 900 includes, but is not limited to a server. In an embodiment, a printed wiring-board island computing system 900 includes, but is not limited to a workstation. In an embodiment, a printed wiring-board island system 900 includes, but is not limited to a cellular telephone. In an embodiment, a printed wiring-board island system 900 includes, but is not limited to a mobile computing device. In an embodiment, a printed wiring-board island system 900 includes, but is not limited to a smart phone. In an embodiment, a printed wiring-board island system 900 includes, but is not limited to an internet appliance. In an embodiment, the printed wiring-board island computing system is part of a wearable computing system. In an embodiment, the printed wiring-board island computing system is part of a drone. Other types of computing device may be configured with the printed wiring-board island computing system that includes non-planar interconnect embodiments.

In an embodiment, the processor 910 has one or more processing cores 912 and 912N, where 912N represents the Nth processor core inside processor 910 where N is a positive integer. In an embodiment, the electronic device system 900 using a printed wiring-board island computing system embodiment that includes multiple processors including 910 and 905, where the processor 905 has logic similar or identical to the logic of the processor 910. In an embodiment, the processing core 912 includes, but is not limited to, pre-fetch logic to fetch instructions, decode logic to decode the instructions, execution logic to execute instructions and the like. In an embodiment, the processor 910 has a cache memory 916 to cache at least one of instructions and data for the printed wiring-board island in the system 900. The cache memory 916 may be organized into a hierarchal structure including one or more levels of cache memory.

In an embodiment, the processor 910 includes a memory controller 914, which is operable to perform functions that enable the processor 910 to access and communicate with memory 930 that includes at least one of a volatile memory 932 and a non-volatile memory 934. In an embodiment, the processor 910 is coupled with memory 930 and chipset 920. The processor 910 may also be coupled to a wireless antenna 978 to communicate with any device configured to at least one of transmit and receive wireless signals. In an embodiment, the wireless antenna interface 978 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 934 includes, but is not limited to, flash memory, phase change memory (PCM), read-only memory (ROM), electrically erasable programmable read-only memory (EEPROM), or any other type of non-volatile memory device.

The memory 930 stores information and instructions to be executed by the processor 910. In an embodiment, the memory 930 may also store temporary variables or other intermediate information while the processor 910 is executing instructions. In the illustrated embodiment, the chipset 920 connects with processor 910 via Point-to-Point (PtP or P-P) interfaces 917 and 922. Either of these PtP embodiments may be achieved using a printed wiring-board island computing system embodiment as set forth in this disclosure. The chipset 920 enables the processor 910 to connect to other elements in the printed wiring-board island embodiments in a system 900. In an embodiment, interfaces 917 and 922 operate in accordance with a PtP communication protocol such as the Intel® QuickPath Interconnect (QPI) or the like. In other embodiments, a different interconnect may be used.

In an embodiment, the chipset 920 is operable to communicate with the processor 910, 905N, the display device 940, and other devices 972, 976, 974, 960, 962, 964, 966, 977, etc. The chipset 920 may also be coupled to a wireless antenna 978 to communicate with any device configured to at least do one of transmit and receive wireless signals.

The chipset 920 connects to the display device 940 via the interface 926. The display 940 may be, for example, a liquid crystal display (LCD), a plasma display, cathode ray tube (CRT) display, or any other form of visual display device. In and embodiment, the processor 910 and the chipset 920 are merged into a printed wiring-board island apparatus in a system. Additionally, the chipset 920 connects to one or more buses 950 and 955 that interconnect various elements 974, 960, 962, 964, and 966. Buses 950 and 955 may be interconnected together via a bus bridge 972 such as at least one printed wiring-board island embodiment. In an embodiment, the chipset 920 couples with a non-volatile memory 960, a mass storage device(s) 962, a keyboard/mouse 964, and a network interface 966 by way of at least one of the interface 924 and 974, the smart TV 976, and the consumer electronics 977, etc.

In and embodiment, the mass storage device 962 includes, but is not limited to, a solid state drive, a hard disk drive, a universal serial bus flash memory drive, or any other form of computer data storage medium. In one embodiment, network interface 966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family. Home Plug AV (HPAV), Ultra Wide Band (UWB), Bluetooth, WiMax, or any form of wireless communication protocol.

While the modules shown in FIG. 9 are depicted as separate blocks within the printed wiring-board island embodiment in a computing system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) can be incorporated into the processor core 912.

Where useful, the computing system 900 may have an outer shell. Referring to FIGS. 1, 2 and 3, the PCB 30 includes a shell structure 111 that provides both physical and electrical protection for the PWB island-containing semi-conductive package 10.

To illustrate the printed wiring-board island embodiments and assembly methods disclosed herein, a non-limiting list of examples is provided herein:

Example 1 is a semiconductive device substrate, comprising: a printed wiring-board island including a die side and a board side, wherein the a semiconductive-package includes a routing density on the die-side and a printed circuit board routing density on the board-side; a printed circuit board onto which the printed wiring-board island is mounted, wherein the printed circuit board includes the printed circuit board routing density, wherein the printed wiring-board island board-side routing density matches the printed circuit board routing density, and wherein the printed wiring-board island creates an island form factor on the printed circuit board.

In Example 2, the subject matter of Example 1 optionally includes a reflowed solder-paste printed on one of the printed wiring-board island and the printed circuit board, wherein the reflowed solder paste bonds the printed wiring-board island to the printed circuit board.

In Example 3, the subject matter of any one or more of Examples 1-2 optionally include a reflowed solder-paste printed on one of the printed wiring-board island and the printed circuit board, wherein the reflowed solder paste bonds the printed wiring-board island to the printed circuit board; and a thermo-coupling, non-conductive paste also bonding the printed wiring-board island and the printed circuit board.

In Example 4, the subject matter of any one or more of Examples 1-3 optionally include a semiconductive device package disposed on the printed wiring-board island and coupled to the printed wiring-board island on the die-side by a ball-grid array, wherein the ball-grid array reflects the semiconductive-package routing density.

In Example 5, the subject matter of any one or more of Examples 1-4 optionally include wherein the printed wiring-board island includes trace-layer structure selected from the group consisting of a single trace layer, two trace layers, three trace layers and four trace layers.

In Example 6, the subject matter of any one or more of Examples 1-5 optionally include at least one semiconductive device package disposed on the printed wiring-board island and coupled to the printed wiring-board island and to the printed circuit board by a ball-grid array, wherein the ball-grid array at least partially penetrates the printed wiring-board island, and wherein the ball-grid array partially reflects the semiconductive-package routing density.

In Example 7, the subject matter of Example 6 optionally includes a bump pad embedded within the printed wiring-board island at a trace level, wherein a ball from the ball-grid array contacts the bump pad.

In Example 8, the subject matter of Example 7 optionally includes a bump pad embedded within the printed wiring-board island at a trace level, wherein a ball from the ball-grid array contacts and passes through a mesh structure of the bump pad.

In Example 9, the subject matter of any one or more of Examples 6-8 optionally include wherein the printed wiring-board island includes trace-layer structure selected from the group consisting of a single trace layer, two trace layers, three trace layers and four trace layers.

In Example 10, the subject matter of any one or more of Examples 7-9 optionally include a solder-paste printed bump in contact with the bump pad at a board side of the printed wiring-board island.

In Example 11, the subject matter of any one or more of Examples 6-10 optionally include a bump pad embedded within the printed wiring-board island at a trace level, wherein the bump pad has a mesh form factor.

In Example 12, the subject matter of any one or more of Examples 1-11 optionally include a semiconductive device package disposed on the printed wiring-board island and coupled to the printed wiring-board island on the die-side by a ball-grid array, wherein the ball-grid array reflects the semiconductive-package routing density, wherein the semiconductive device package includes a core processor, a baseband processor, a memory module and at least one of a memory-controller hub and a platform-controller hub.

In Example 13, the subject matter of Example 12 optionally includes a bump pad embedded within the printed wiring-board island at a trace level, wherein a ball from the ball-grid array contacts the bump pad.

In Example 14, the subject matter of any one or more of Examples 12-13 optionally include a bump pad embedded within the printed wiring-board island at a trace level, wherein a ball from the ball-grid array contacts and passes through a mesh structure of the bump pad.

In Example 15, the subject matter of any one or more of Examples 13-14 optionally include a reflowed solder-paste printed on one of the printed wiring-board island and the printed circuit board, wherein the reflowed solder paste bonds the printed wiring-board island to the printed circuit board; and a thermo-coupling, non-conductive paste also bonding the printed wiring-board island and the printed circuit board.

Example 16 is a method of assembling a semiconductive device substrate, comprising: assembling a printed wiring-board island to a printed circuit board, wherein the printed wiring board includes a die-side routing density and a board-side routing density; and assembling a semiconductive device package to the printed wiring-board island on the die side.

In Example 17, the subject matter of Example 16 optionally includes solder-paste printing onto the printed circuit board before assembling the printed wiring-board island to the printed circuit board.

In Example 18, the subject matter of Example 17 optionally includes printing a thermo-coupling non-conductive paste onto one of the printed wiring-board island and the printed circuit board.

In Example 19, the subject matter of any one or more of Examples 16-18 optionally include solder-paste printing onto the printed wiring-board island before assembling the printed wiring-board island to the printed circuit board.

In Example 20, the subject matter of Example 19 optionally includes printing a thermo-coupling non-conductive paste onto one of the printed wiring-board island and the printed circuit board.

Example 21 is a computing system, comprising: a printed wiring-board island including a semiconductive-package routing density on a die-side thereof and a printed circuit board routing density on a board-side thereof; a printed circuit board onto which the printed wiring-board is mounted, wherein the printed circuit board includes the printed circuit board routing density, and wherein the printed wiring-board island creates an island form factor on the printed circuit board; a semiconductive device package disposed on the printed wiring-board island and coupled to the printed wiring-board island by a ball-grid array, wherein the ball-grid array reflects the semiconductive-package routing density; and an outer shell covering the semiconductive device package, the printed wiring-board island and the printed circuit board.

In Example 22, the subject matter of Example 21 optionally includes wherein the ball-grid array least partially penetrates the printed wiring-board island, and wherein the ball-grid array partially reflects the semiconductive-package routing density.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductive device, comprising:
   a printed wiring-board (PWB) structure having first wiring components with a first density on a first side thereof and having second wiring components with a second density on a second side thereof;
   a printed circuit board having wiring components with the second density, wherein the PWB structure is mounted onto the printed circuit board and is smaller than the printed circuit board in at least one dimension; and
   a semiconductive device package over the PWB structure and coupled to the PWB structure by a ball-grid array, wherein the ball-grid array includes wiring components with the first density.

2. The semiconductive device of claim 1, wherein the ball-grid array at least partially penetrates the PWB structure.

3. The semiconductive device of claim 1, further including a bump pad embedded within the PWB structure, wherein a ball from the ball-grid array contacts the bump pad.

4. The semiconductive device of claim 1, further including a bump pad embedded within the PWB structure, wherein a ball from the ball-grid array contacts and passes through one or more openings in the bump pad.

5. The semiconductive device of claim 1, further including a bump pad embedded within the PWB structure, wherein a ball from the ball-grid array contacts and passes through a mesh structure of the bump pad.

6. The semiconductive device of claim 1, wherein the semiconductive device package includes a core processor, a baseband processor, a memory module, and at least one of a memory-controller hub and a platform-controller hub.

7. An electronic device, comprising:
   a PWB structure including a die side and a board side, wherein the PWB structure includes first routing components at a first density on the die side and further includes second routing components at a second density on the board side;
   a printed circuit board having third routing interconnects at a third density, wherein the PWB structure is coupled to the printed circuit board, a footprint of the PWB structure is smaller than the printed circuit board, and the second density matches the third density;
   a first solder between the PWB structure and the printed circuit board, wherein the first solder electrically connects the PWB structure and the printed circuit board; and
   a second solder bonding the PWB structure and the printed circuit board.

8. The electronic device of claim 7, further including a semiconductive device package coupled to the die side of the PWB structure by a ball-grid array, wherein the ball-grid array has fourth routing components at a fourth density.

9. The electronic device of claim 8, wherein the semiconductive device package includes a core processor, a baseband processor, a memory module, and at least one of a memory-controller hub and a platform-controller hub.

10. The electronic device of claim 8, wherein the semiconductive device package includes a die embedded with a molding compound.

11. The electronic device of claim 8, further including a bump pad embedded within the PWB structure, wherein a ball of the ball-grid array contacts the bump pad.

12. The electronic device of claim 8, wherein the ball-grid array at least partially penetrates the PWB structure.

13. The electronic device of claim 8, further including a bump pad embedded within the PWB structure, wherein a ball of the ball-grid array contacts and passes through one or more openings in the bump pad.

14. The electronic device claim 7, further including a bump pad embedded within the PWB structure 7, wherein a ball from the ball-grid array contacts and passes through a mesh structure of the bump pad.

15. The semiconductive device of claim 1, wherein the PWB structure includes an organic section between the first side and the second side.

16. The electronic device of claim 8, wherein the first density matches the fourth density.

17. The electronic device of claim 8, wherein the second solder does not electrically connect the PWB structure and the printed circuit board.

18. A semiconductive device, comprising:
a printed circuit board;
a printed wiring-board island comprising routing having a first routing density on a first side thereof and further comprising routing having a second routing density on a second side thereof, wherein the routing on the first side of the printed wiring-board island is electrically coupled to routing on a side of the printed circuit board, and the routing on the side of the printed circuit board has the first routing density; and
a semiconductive device package coupled to the second side of the printed wiring-board island by a ball-grid array, wherein the ball-grid array includes routing having the second routing density.

19. The semiconductive device of claim 18, wherein a footprint of the printed wiring-board island is within a footprint of the printed circuit board.

20. The semiconductive device of claim 18, further including a bump pad embedded within the printed wiring-board island, wherein a ball from the ball-grid array contacts the bump pad.

* * * * *

UNITED STATES PATENT AND TRADEMARK OFFICE
CERTIFICATE OF CORRECTION

PATENT NO. : 11,877,403 B2
APPLICATION NO. : 17/486462
DATED : January 16, 2024
INVENTOR(S) : Georg Seidemann et al.

It is certified that error appears in the above-identified patent and that said Letters Patent is hereby corrected as shown below:

In the Claims

In Column 15, Claim 14, Line 11, delete "device claim 7," and insert -- device of claim 7, --, therefor.

In Column 15, Claim 14, Line 12, delete "structure 7," and insert -- structure, --, therefor.

In Column 15, Claim 14, Line 13, delete "from the" and insert -- of the --, therefor.

Signed and Sealed this
Twentieth Day of February, 2024

Katherine Kelly Vidal
*Director of the United States Patent and Trademark Office*